United States Patent [19]

Grimes

[11] Patent Number: 4,658,333

[45] Date of Patent: Apr. 14, 1987

[54] VARIABLE LENGTH BACKPLANE BUS

[75] Inventor: Gary J. Grimes, Thornton, Colo.

[73] Assignee: AT&T Information Systems Inc., Holmdel, N.J.

[21] Appl. No.: 796,724

[22] Filed: Nov. 8, 1985

[51] Int. Cl.$^4$ .................................................. H05K 1/14
[52] U.S. Cl. ...................................... 361/413; 379/328; 361/412
[58] Field of Search .................... 361/412, 413, 415; 179/98

[56] References Cited

U.S. PATENT DOCUMENTS

| | | | |
|---|---|---|---|
| 3,794,954 | 2/1974 | Reimer | 361/413 X |
| 3,800,097 | 3/1974 | Maruscak et al. | 361/413 X |
| 3,993,935 | 11/1976 | Phillips et al. | 361/413 X |
| 4,253,087 | 2/1981 | Saal | 361/413 X |
| 4,420,793 | 12/1983 | Strandberg | 361/412 X |
| 4,472,765 | 9/1984 | Hughes | 361/413 |
| 4,511,950 | 4/1985 | Bunner et al. | 361/413 |
| 4,514,786 | 4/1985 | Charrau | 361/412 X |
| 4,520,429 | 5/1985 | Hosking | 361/413 |
| 4,575,780 | 3/1986 | Brombal et al. | 361/412 X |

Primary Examiner—R. R. Kucla
Attorney, Agent, or Firm—Donald M. Duft

[57] ABSTRACT

Presently available printed wiring board backplanes used in switching systems and the like are wired at the time of manufacture to enable only a fixed number of groups of circuit boards to communicate with each other. This limitation prevents a backplane from having the capability of serving a varying number of groups of boards. The present invention enables a backplane to have the capability of serving a variable number of groups of boards. The number of groups that can be served by a given backplane need not be fixed when the backplane is designed and manufactured. Each backplane of the present invention comprises backplane bus conductors and board conductors. The boards are effectively a part of the bus. The use of a first type of board in a backplane connector continues the bus to the adjacent connector. The use of a second type of board terminates the bus and does not extend it beyond the connector into which the second type of board is inserted. This permits a group of boards comprising one board of the second type and one or more boards of the first type to communicate with each other. The invention also permits communication to continue within a group if a board of the first type is removed from its connector. The invention advantageously permits the backplane to be reconfigured in the field by merely arranging the boards.

3 Claims, 4 Drawing Figures

ND LENGTH BACKPLANE BUS

VARIABLE LENGTH BACKPLANE BUS

TECHNICAL FIELD

This invention relates to a backplane bus of the type used in communication switching and data processing systems.

BACKGROUND OF THE INVENTION

A backplane bus is used in switching systems and the like to convey signals from circuitry on a first printed circuit board to circuitry on one or more other printed circuit boards served by the same bus. The bus itself is a printed conductive trace on an elongated board termed a backplane. This backplane has mounted on it a plurality of connectors into which the printed circuit boards are plugged. The conductors of the backplane bus connect to pins of the connectors so that the circuitry mounted on the different printed circuit boards plugged into the connectors can intercommunicate via the backplane bus. A plurality of interconnected printed circuit boards and the backplane bus serving these boards constitute what is termed herein as "a bus group".

In accordance with one prior art arrangement, all connectors mounted on a backplane board are often connected together electrically by the board's backplane bus at the time of design and manufacture of the backplanes. This is a disadvantage because only a single bus group can be served by such a single backplane bus. This prevents a backplane board from having the capability of serving more than one bus group or serving a varying number of groups of printed circuit boards in the event the needs of the system user change after installation.

Strategies have been devised to deal with this problem. One strategy is, after manufacture, to physically cut the printed conductive trace constituting the backplane bus. The backplane bus is cut between two adjacent backplane connectors. This way, circuit boards plugged into connectors on one side of the cut make up one bus group, and the boards plugged into connectors on the other side of the cut make up another bus group. This strategy has the disadvantages that the backplane cannot be reconfigured easily back to its original design. Another disadvantage is that if an error is made in the cutting operation, the backplane must be discarded and replaced since it cannot easily be physically restored. The process of planning the cut and cutting the bus is an expensive manual operation. Also, if the backplane bus is a conductive trace in the middle of a multi-layer board, it may be impossible to cut.

Another strategy for enabling a single backplane bus to serve a different number of bus groups is to manufacture a number of different models of the backplane in which there are open bus connections between adjacent backplane connectors as required to define the number of board groups to be served. This way, circuit boards plugged into connectors on one side of an open connection make up one bus group, and boards plugged into connectors on the other side of the open circuit make up another bus group. Each different backplane model has the open circuit between different backplane connectors as required. One model, for instance, may have an open circuit between the third and fourth connectors of the backplane. Another model may have an open circuit between the fifth and sixth connectors. This strategy has the disadvantage of increasing the number of backplane models that must be maintained in inventory.

SUMMARY OF THE INVENTION

The present invention solves these and other problems by providing a backplane bus that can serve a varying number of bus groups. The bus and the number of bus groups served per backplane can be easily reconfigured in the field as the needs of the system user change. As before, the backplane bus of the invention interconnects pins on the connectors mounted on the backplane and, in turn, the circuit boards plugged into these connectors. However, the subject backplane bus is not merely the conductive trace on the backplane interconnecting the backplane connectors. The bus also comprises circuitry on the circuit boards served by and plugged into backplane connectors.

The boards that are plugged into the backplane are of a first and a second type. Boards of the first type extend the backplane bus between adjacent connectors. A board of the second type terminates the bus and does not extend it between adjacent connectors. This second type of board is referred herein to as an interface/termination board.

A backplane bus group comprises one or more printed circuit boards of the first type together with a single interface/termination board. The serial chain of connections that make up the backplane bus using the first type of boards is broken by inserting an interface/termination board into the appropriate connector. A circuit board of the first type installed in the next adjacent connector begins the next backplane bus group on the same backplane. Thus, more than one bus group can be served on a single backplane without modification of or damage to the backplane bus. The backplane bus groups can be subsequently reconfigured merely by rearranging, adding or subtracting circuit boards of the first type and by inserting an interface/termination board in the appropriate connectors to terminate each newly formed bus group.

It is not a disadvantage that one circuit board per bus group (the interface/termination board) must be wired differently from the others. This is true because there is ordinarily a circuit board in each backplane bus group that is unique in other ways. This otherwise unique circuit board can be built so that it is an interface/termination board.

Another aspect of the invention comprises a series of connections extending from each backplane connector to the connector immediately beyond the next adjacent connector. These connections, together with circuitry on the printed circuit boards plugged into these connectors, permits bus signals to bypass a single backplane connector. Consider three printed circuit boards plugged into three adjacent backplane connectors. The outer ones of the three boards are connected in two ways. First, the outer boards are connected by what is termed a basic bus connection extending through the middle circuit board of the three. The outer boards are also connected by what is termed a bypass bus which bypasses the middle board and directly connects the two outer boards. This being the case, the outer circuit boards remain connected by the bypass bus when the inner board is removed. This permits the rest of the bus group to function via the bypass bus if a single board is removed.

An electronic switch element on each board of the invention is controllable to connect the bypass bus of the board to the basic bus of the same board. This switch on any given board is closed when a board of the first type is installed in the connector immediately adjacent to and on a first side (say the left side) of the given board. The bypass bus of the board then forms a redundant conductive path parallel to the basic bus of the same board since the closure of the switch on the board interconnects its basic bus to its bypass bus. The removal of the board of the first type from its connector adjacent to and on the left side of the given board allows the switch on the given board to remain closed and continue the interconnection between the basic and the bypass bus of the board. This permits the basic bus of the board on the left side of the removed board to communicate with the basic bus on the given board via the closed switch contacts of the given board.

When an interface/termination board is inserted in a connector on the left side of a given board, a special control potential on the interface/termination board is applied to the given board to open the switch element on the given board. This disconnects the basic bus and the bypass bus on the given board from each other. This enables the given board to be the first board of a new bus group since its basic bus is not connected via its bypass bus to the bus on a board of the first type on the left side of the interface termination board.

In summary, the backplane bus of the invention is an improvement over the priorly available arrangements in that it is serially continued from backplane connector to connector via circuitry on the circuit boards of the first type plugged into the connectors. These serial connections and the basic backplane bus can be broken at any point by the use of an interface/termination board in the appropriate connector. A new bus group on the same backplane is started by the use of a circuit board of the first type in the next adjacent connector. Furthermore, each backplane connector can be bypassed by the bypass bus. If a circuit board is removed from its connector, the bypass bus is connected to the basic bus on the next circuit board beyond the removed board. A connection remains among the remaining boards in the backplane bus group so that they can continue to communicate with each other.

BRIEF DESCRIPTION OF THE DRAWINGS

The invention and its advantages may be better understood from a reading of the following description of one possible preferred exemplary embodiment thereof taken in conjunction with the drawings in which:

FIG. 4 illustrates the combination.

DETAILED DESCRIPTION

Figure 1:
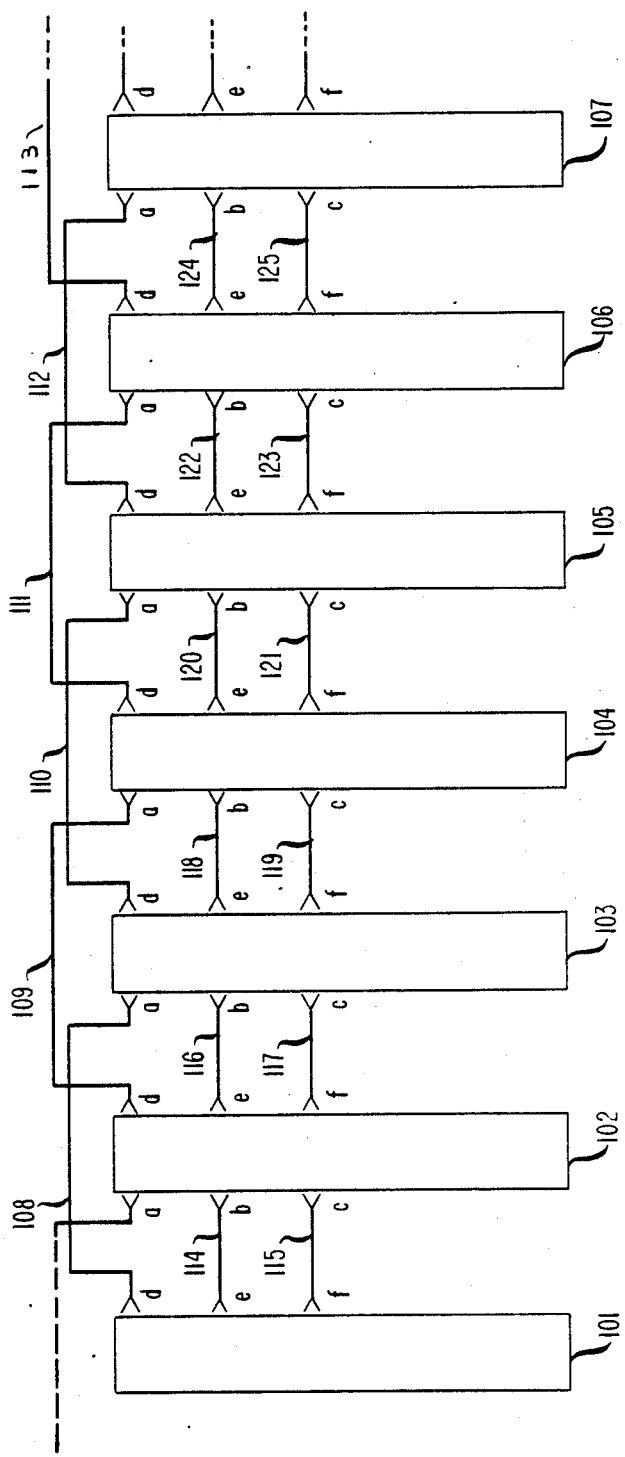
FIG. 1 illustrates the backplane bus of the invention.

The backplane bus of the present invention is shown on FIG. 1 and comprises backplane connectors 101 through 107, bus connections 108 through 113, connections 114 through 125, and pins a, b, c, d, e and f on each connector. The basic bus comprises connections 115, 117, 119, 121, 123, and 125. These connections connect pin f of one connector to pin c of the next connector. The bypass bus comprises connections 108 through 113. A bypass bus connection, such as 108, connects to pin d of one connector, such as connector 101, it bypasses the next connector, such as 102, and connects to pin a of the following connector, such as 103.

An electronic switch element on each circuit board is controllable to connect the bypass bus to the basic bus of the board. These switches are operated, as subsequently described, via connections 114, 116, 118, 120, 122, and 124, each of which connects pin b of one connector to pin e of the adjacent connector.

Figure 2:
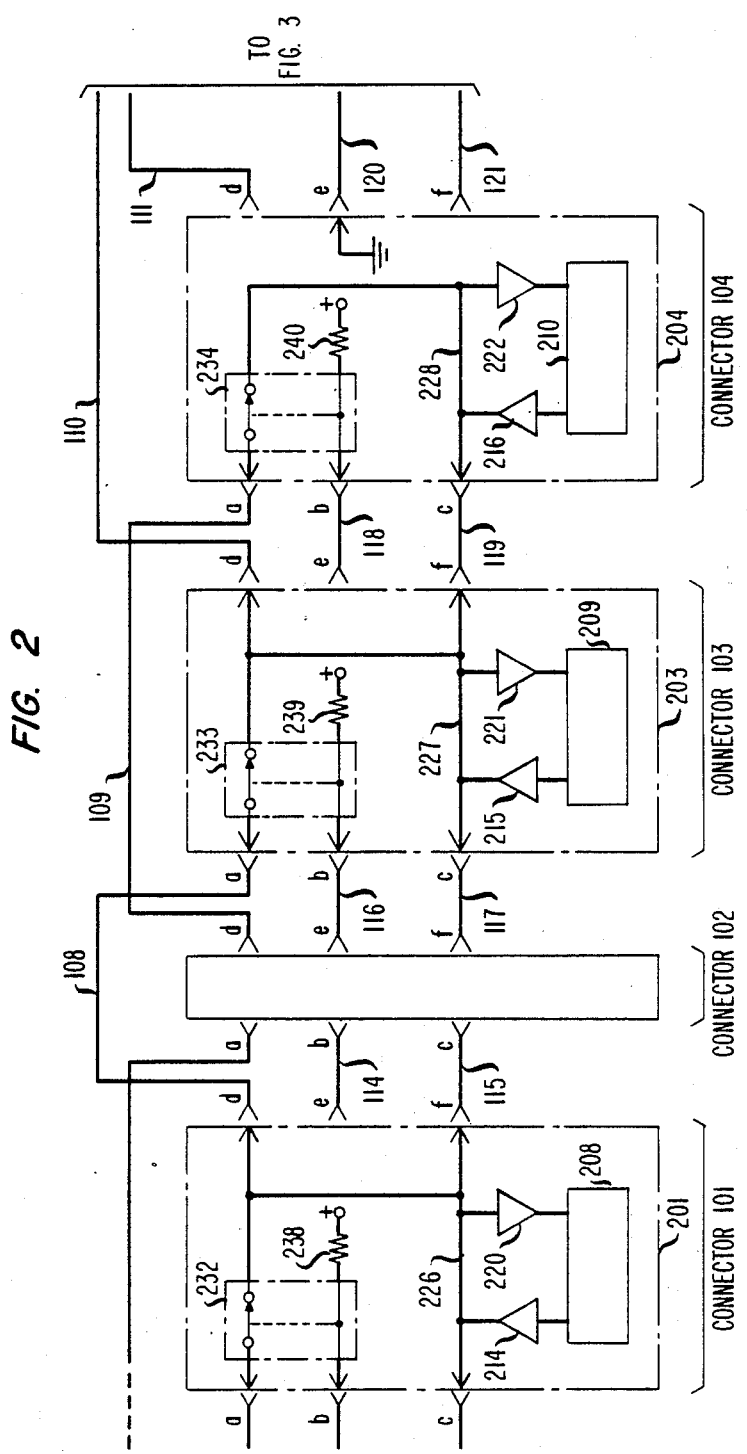
FIGS. 2 and 3 illustrate the backplane bus of the invention with circuit boards installed.
Figure 3:
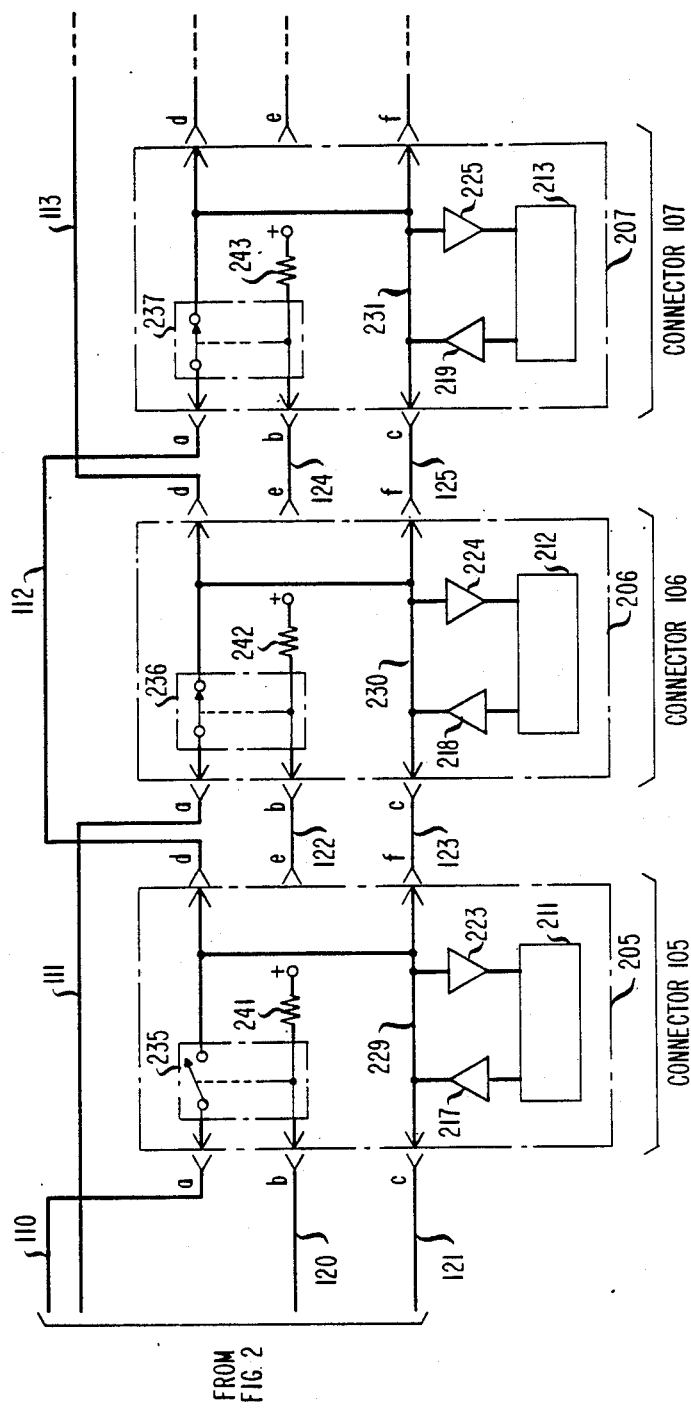

FIGS. 2 and 3 illustrate the backplane bus of FIG. 1 with circuit boards 201 and 203 through 207 installed in backplane connectors 101 and 103 through 107, respectively. Circuit board 204 is an interface/termination board. There is no circuit board shown installed in backplane connector 102. The basic busses include the board conductors 226 through 231. Each circuit board, including the interface/termination board 204, has an associated one of elements 208 through 213. These elements contain the circuitry that performs the system function of the board i.e. the function the board within the system of which the elements of FIGS. 2 and 3 are a part, FIG. 4. The signal output from these circuit elements 208 through 213 is conveyed to the conductors of the basic on each board by means of buffers 214 through 219. The signal input to these circuit elements 208 through 213 is extended from the basic bus on each board by means of buffers 220 through 225.

Electronic solid-state switches 232 through 237 are controllable to change their conductive state and connect the conductors of the bypass bus on each board to those of the basic bus on each board as subsequently described. Each switch is closed to interconnect pins a and d of its board when its gate element at pin b of its board is permitted to be at a high potential through one of resistors 238 through 243. Each switch is in an open state when its gate is connected to a ground on the preceding board via pins b and e and one of conductors 114, 116, 118, 120, 122 and 124.

Examples of operation. The connections between circuit boards 205 through 207 are typical of a completed basic bus. A bus group begins at pin c and path 229 of board 205 because board 204 is an interface/termination board of another bus group. Path 229 conveys data to and from the basic bus for circuit element 211 of board 205 via buffers 217 and 223, respectively. Data is conveyed between circuit boards 205 and 206 by backplane connection 123. Basic bus path 230 of board 206 and backplane connection 125 convey data through circuit board 206 and on to path 231 of board 207 and so forth for the rest of the bus group.

Consider a signal originating in circuit element 211 of board 205 and destined for circuit element 212 of board 206. The data signal is conveyed to board path 229 by buffer 217. The data signal cannot pass through switch 235 to bypass bus 110 because the gate of switch 235 is held low by the ground on circuit board 204 which is connected to the gate of switch 235 by backplane connection 120. This ground holds switch 235 open. The data signal cannot pass to bus conductor 228 on board 204 because conductor 228 does not connect with pin f and backplane conductor 121. The data signal extends from board conductor 229 to board conductor 230 of board 206 via backplane connection 123. The data signal extends to destination circuit element 212 of board 212 via buffer 224. The data signal is, of course, also conveyed the entire length of the bus group. Protocols and addressing ensure that the data signal is received only by the intended circuit. Such protocols and addressing techniques are well known to the art.

Another complete, but separate, bus group is made up of circuit boards 201 through 204. Circuit board 201 is the first board on the backplane, a circuit board has been removed from backplane connector 102, the bus group continues through circuit board 203, and the bus group is terminated by interface/termination board 204. Consider a data signal that originates in circuit element 208 of board 201 and is destined for circuit element 210 of board 204. Circuit element 208 applies the data signal to conductor 226 via buffer 214. Since there is no circuit board in backplane connector 102, the only path for the signal on path 226 to take is via bypass bus 108 to terminal a of board 203 and its switch 233. There is currently no circuit board in backplane connector 102 to ground the gate element of switch 233 via connection 116. Thus, a high level signal from the + supply of board 203 holds the gate of switch 233 high via resistor 239. The + signal at the gate of switch 233 closes the switch so that it conducts the data signal from bypass bus element 108 to path 227 which is a part of the basic bus of board 203. The data signal continues over the basic bus via backplane connection 119 and conductor 228 of board 204 to buffer 222. Input Buffer 222 applies the data signal to circuit element 210 of board 204 which is the destination of the signal. The data signal on conductor 228 does not pass to backplane conductors 111 and 121 because these paths are not connected to conductor 228 on board 204. These connections do not exist because board 204 is of the interface/termination type. A data signal from any circuit element 208 through 210 can be conveyed in either direction to any other of these circuit elements by the path just described. In this way, the bus of the present invention can convey signals from circuit board to circuit board within a board group over the basic bus connected to pins f and c of each backplane connector as well as over any activated bypass bus connected to pins a and d of each backplane connector.

The data signal just described does not go on to the next bus group on the same backplane. In this way, the two bus groups of the disclosed backplane are kept separate. Board conductor 228 does not continue to pin f of interface/termination board 204. Thus the basic bus terminates at interface/termination board 204. An interface/termination board is unique in that it does not continue the basic bus to its pin f. The data signal on path 228 of board 204 is also not connected to circuit board 205 via conductor 227 of board 203 and bypass bus 110 since the signal is blocked by switch 235 of board 205. Switch 235 is in an open state because the gate of switch 235 is grounded by terminal e of interface/termination board 204. The ground is applied by pin e of interface/termination board 204 and is extended to switch 235 by connection 120. This ground keeps the switch 235 in an open state. Thus a data signal is prevented from passing beyond the interface/termination board of a bus group.

If an interface/termination board, such as board 204, needs to be removed from its connector, the preceding circuit board must be removed first. If the preceding circuit board is not removed before the interface/termination board 204 is removed, the preceding group of circuit boards will erroneously intercommunicate with the next group of circuit boards via contacts of switch 235 which would then be closed since its gate is not grounded by pin c of board 204. In the same manner, when an interface/termination board is replaced, the interface/termination board must be put in place before the preceding circuit board, i.e. board 203, is put in place.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention. Normally, other arrangements may be devised by those skilled in the art without departing from the spirit and the scope of the invention.

What is claimed is:

1. A backplane having a backplane bus comprising;
   a plurality of connectors on said backplane,
   backplane bus conductors segments interconnecting contacts of adjacent ones of said connectors,
   a plurality of boards inserted into a corresponding plurality of adjacent ones of said connectors whereby contacts on each board are connected to corresponding contacts of the connector into which each board is inserted,
   a bus path on each one of said boards extending between said contacts on said one board whereby the backplane bus conductor segments connected to said contacts of the connector into which each said one board is inserted are interconnected via the bus path of said one board so long as said one board remains inserted in its associated connector,
   a switch having at least one pair of contacts on each one of said boards,
   means connecting a first switch contact of each one of said boards to said bus path of said each one board,
   means connecting a second switch contact of each one of said boards beyond the adjacent connector on one side of said each one board to the bus path on another one of said boards currently inserted in the next one of said connectors beyond said adjacent connector, and
   means for normally maintaining said pair of switch contacts of said each one board in a closed state whereby said bus path of said each one board is connected via said closed pair of switch contacts on said each one board to the bus path of said other board to provide a bus path connection between said each one board and said other board when a board is removed from said adjacent connector.

2. The backplane of claim 1 in combination with;
   means responsive to the insertion of a bus termination board into the said last named adjacent connector for opening said pair of switch contacts on said each one board, and
   said opened switch contacts being effective to effect the disconnection of the bus path between said each one board and said other board.

3. A backplane having a backplane bus that includes a plurality of connectors on said backplane, and backplane bus conductors segments interconnecting contacts of adjacent ones of said connectors, and a plurality of backplane bus groups with each of said groups comprising;
   a plurality of boards of a first type inserted into a corresponding plurality of adjacent ones of said connectors whereby contacts on each board are connected to corresponding contacts of the connector into which each board is inserted,
   a bus path on each one of said boards extending between said contacts on said one board whereby the backplane bus conductor segments connected to contacts of the connector into which said one board is inserted are interconnected via the bus path of said one board so long as said one board remains inserted into its associated connector, a second type of board inserted into one of said connectors and having a bus path connected to only a first contact on said second type of board whereby the bus path of a board of said first type inserted into a connector adjacent to and on a first side of the connector into which the second type of board is inserted is in a different one of said bus groups and is not interconnected electrically via backplane conductor segments with the bus path of the second type of board and whereby the bus path of said second type of board is connected electrically to the bus path of a first type of board inserted into an adjacent connector on a second side of the connector into which said board of the second type is inserted via a contact of said board of the second type and a backplane conductor segment, a switch having at least one pair of contacts on each of said boards, means connecting a first switch contact of each of said boards to the bus path of said each board, means connecting a second switch contact of each of said boards beyond the adjacent connector on one side of said each board to the bus path on another board currently inserted in the next one of said connectors beyond said adjacent connector, means for normally maintaining said switch contacts in a closed state on each board not in a connector adjacent to a first side of a connector into which said second type of board is inserted whereby said bus path of said last named each board is connected via said closed switch contacts on said last named each board to the bus path of said other board to provide a bus path between said last named each board and said other board when a board of the first type is removed from said adjacent connector, and means responsive to the insertion of a board of said second type into a connector for opening said switch contacts on a board in a connector adjacent to said first side of said second type of board whereby said bus path of said last named board is not connected via said switch contacts on said last named board to the bus conductor of a board in a connector adjacent to the other side of said second type of board.

* * * * *